(12) United States Patent
Ewer et al.

(10) Patent No.: US 6,255,722 B1
(45) Date of Patent: Jul. 3, 2001

(54) HIGH CURRENT CAPACITY SEMICONDUCTOR DEVICE HOUSING

(75) Inventors: Peter R. Ewer, Surrey; Mark Steers, West Sussex, both of (GB)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/327,025

(22) Filed: Jun. 7, 1999

Related U.S. Application Data

(60) Provisional application No. 60/088,909, filed on Jun. 11, 1998.

(51) Int. Cl.[7] .................................................. H01L 23/495
(52) U.S. Cl. .......................... 257/676; 257/675; 257/727; 257/719; 257/718; 257/726; 257/782; 257/730; 257/735; 361/767; 361/769
(58) Field of Search ................................ 257/727, 719, 257/718, 726, 676, 675, 502, 782, 735, 730; 361/760, 767, 769

(56) References Cited

U.S. PATENT DOCUMENTS

| | | | |
|---|---|---|---|
| 4,503,452 | * | 3/1985 | Yokozawa et al. ............... 357/72 |
| 4,803,545 | * | 2/1989 | Birkle ............................... 357/81 |
| 5,130,888 | * | 7/1992 | Moore ............................. 361/386 |
| 5,521,429 | * | 5/1996 | Aono et al. ...................... 257/676 |
| 5,530,284 | * | 6/1996 | Bailey ............................. 257/670 |
| 6,046,501 | * | 4/2000 | Ishikawa et al. ................. 257/730 |

* cited by examiner

Primary Examiner—Tom Thomas
Assistant Examiner—Luan Thai
(74) Attorney, Agent, or Firm—Ostrolenk, Faber, Gerb & Soffen, LLP

(57) ABSTRACT

A semiconductor device package is provided which can accommodate currents larger than those of similarly sized standard device packages such as the "TO-247" package. Higher currents are accommodated by allowing a larger semiconductor die to be mounted on the device's lead frame than can be mounted on a similarly sized standard package. An improved mold clamping area is also provided which reduces the area from which damaging moisture can enter the molded package and increases the distance required for moisture to contact the die. Clip arrangements are also provided to mount the device package to a circuit board or heat sink, thereby allowing the increased operating temperatures associated with the increased operating currents to be efficiently dissipated. The semiconductor device package has a lead frame having a large area paddle section and at least one leg extending therefrom, the lead frame being of substantially constant thickness, and the paddle section being continuous and free of openings therethrough. A semiconductor die is mounted to the paddle section of the lead frame, the semiconductor die occupying substantially all of the surface area of a side of the paddle section upon which the semiconductor die is mounted. The full surface of the die and at least the side of the paddle section upon which the semiconductor die is mounted are covered by a common and uninterrupted mold housing.

7 Claims, 6 Drawing Sheets

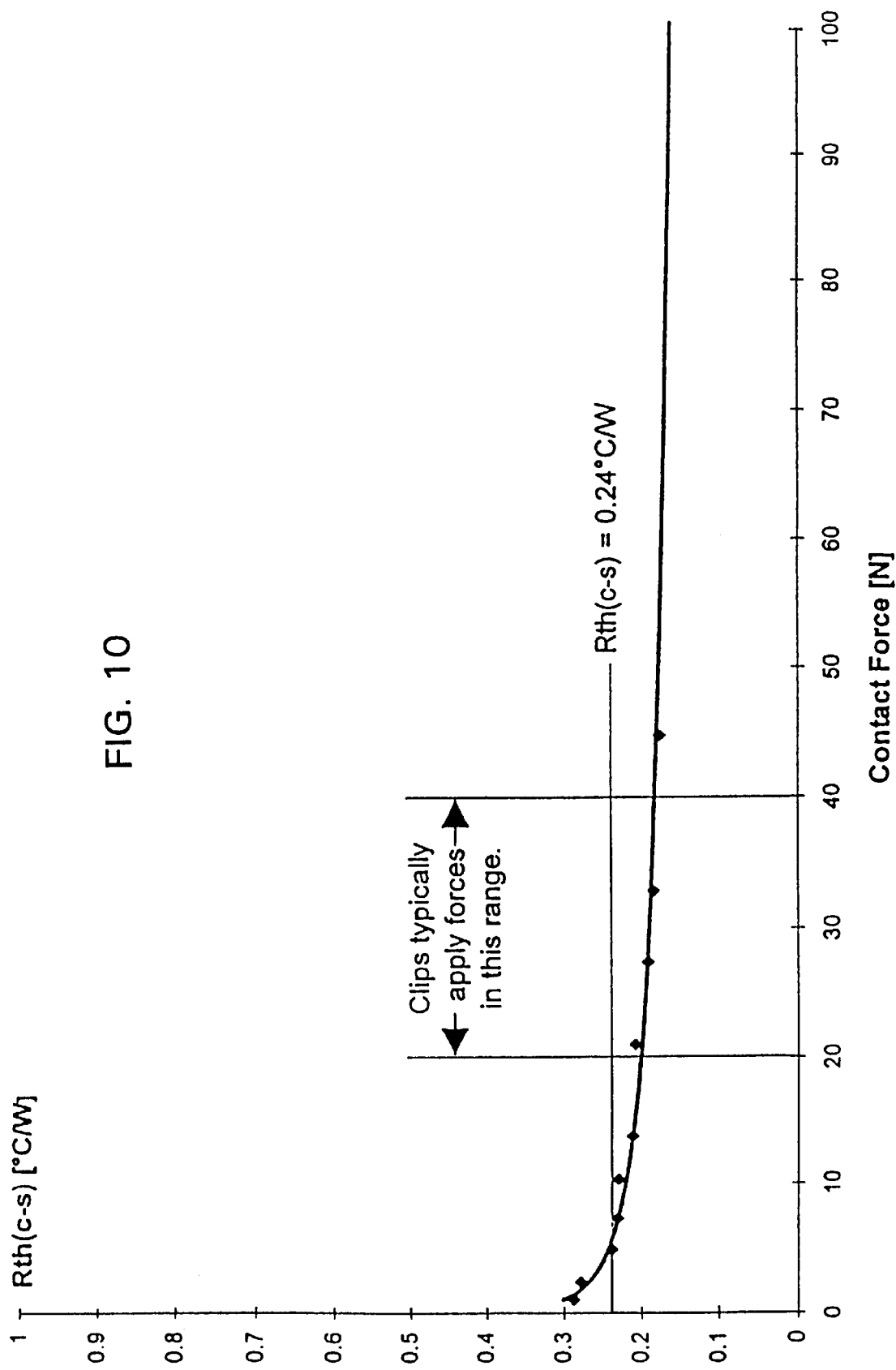

HIGH CURRENT CAPACITY SEMICONDUCTOR DEVICE HOUSING

This application is based on, and claims priority to, U.S. Provisional Application No. 60/088,909, titled HIGH CURRENT CAPACITY SEMICONDUCTOR DEVICE HOUSING, filed Jun. 11, 1998, whose contents are incorporated herein by reference.

BACKGROUND OF THE INVENTION

This invention relates to discrete semiconductor device packages or housings and more specifically relates to a semiconductor device housing which permits an increased area die in a lead frame of given area and permits improved clamping of the device during molding.

Semiconductor device packages or housings are well known. One such device is known by the industry style number "TO-247". Such devices commonly have 3 output lead conductors extending through the package surface which are connected to a semiconductor die, which may be power MOSFET or IGBT die or the like. The bottom surface of the lead frame paddle which receives the die is exposed for pressure contact by bolting it through an opening in the package to a heat sink.

The present invention permits the use of a larger die in a type TO-247 package of given size, permits its improved clamping to a heat sink, and provides an increased creepage distance between leads.

SUMMARY OF THE INVENTION

In accordance with the present invention, a TO-247 style package is modified to remove the mounting bolt opening from the lead frame and to mount the device to a heat sink by a novel spring clamp (clip) arrangement. This permits an increase in the area of the semiconductor die which can be mounted within the device. A notch is also provided in the housing plastic between the leads exiting the housing to increase the creepage distance between the leads. A novel countersunk set of corner openings in the housing expose the lead frame corners to permit corner clamping during molding and improve the hermeticity of the package, i.e., the extent to which a hermetic seal is made with the lead frame around the die and wire bonds.

The use of the novel clip mounting has the following advantages:

1. Quick and simple operation at low cost.
2. Up to 2.5 kilograms of spring pressure can be applied to the center of the package.
3. The package is mounted with a consistent thermal resistance to a heat sink.
4. There is a low risk of damage to the part during mounting to a heat sink.
5. The structure is applicable to mass production manufacture.

The maximum die area usable with the present invention is 10 mm×14 mm. This can be provided by a single MOSFET die such as the HEX 7.3 size die made by the International Rectifier Corporation, with a power density of 300 w. Alternatively, a MOSFET of size HEX6 and a fast recovery diode (FRED 51) also made by International Rectifier Corporation, can be copacked in the same package in the manner of the device type IRGPSH60UD device of International Rectifier Corporation.

The novel package of the invention can receive a die normally associated with the TO-264 package. A die used in a TO-264 package is typically larger than a die used in the TO-247 package. However, the TO-247 package of the present invention has a smaller footprint, a higher current rating and lower cost than the larger TO-264 package. By comparison to a typical TO-247 package, the package of the invention has the same footprint but a larger die and higher current rating. Note that the output conductors or legs of the present invention have an increased cross-sectional area to accommodate the higher package current.

The ratio of die area to package area is shown in the following table:

| PACKAGE TYPE | DIE/PACKAGE RATIO |
|---|---|
| TO-264 | 17% |
| TO-220 | 16% |
| TO-247 | 19% |
| PACKAGE OF INVENTION | 31% |

As used in the above table, the package area refers to the total footprint area, including the legs, that the package would occupy if transversely mounted on a circuit board or heat sink. Thus, the package of the present invention can accommodate a die over 1.5 times the size of the die supported by a typical TO-247 package. In addition, the package of the present invention provides a more efficient use of the available lead frame real estate than do the typical TO-220, TO-247 and TO-264 packages.

The invention provides a semiconductor device package in which a lead frame has a large area paddle section and at least one leg extending therefrom, the lead frame being of substantially constant thickness, and the paddle section being continuous and free of openings therethrough. A semiconductor die is mounted to the paddle section of the lead frame, the semiconductor die occupies substantially all of the surface area of a side of the paddle section upon which said semiconductor die is mounted, and the full surface of the die and at least the side of the paddle section upon which the semiconductor die is mounted are covered by a common and uninterrupted mold housing, at least one leg protruding therefrom and the mold housing being free of openings therethrough.

The novel package of the invention also is less susceptible to moisture intrusion due to the placement of the molding clamp openings at the device corners, creating a longer moisture path into the package interior than if the molding clamp openings were kept on the lateral portions of the device. This is the case because the larger die accommodated in the inventive package is closer to the sides of the package than the corners.

Other features and advantages of the present invention will become apparent from the following description of the invention which refers to the accompanying drawings.

BRIEF DESCRIPTION OF THE DRAWINGS

FIG. 10 shows the contact force as a function of thermal resistance for the clip mounts of the invention.

Figure 3:
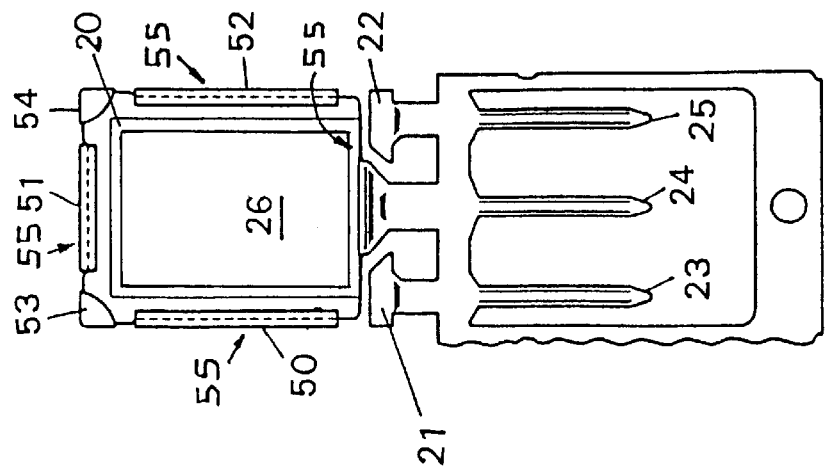
FIG. 3 shows the lead frame used with the present invention.

For the purpose of illustrating the invention, there is shown in the drawings a form which is presently preferred, it being understood, however, that the invention is not limited to the precise arrangement and instrumentality shown.

DETAILED DESCRIPTION OF THE PREFERRED EMBODIMENTS

Figure 1:
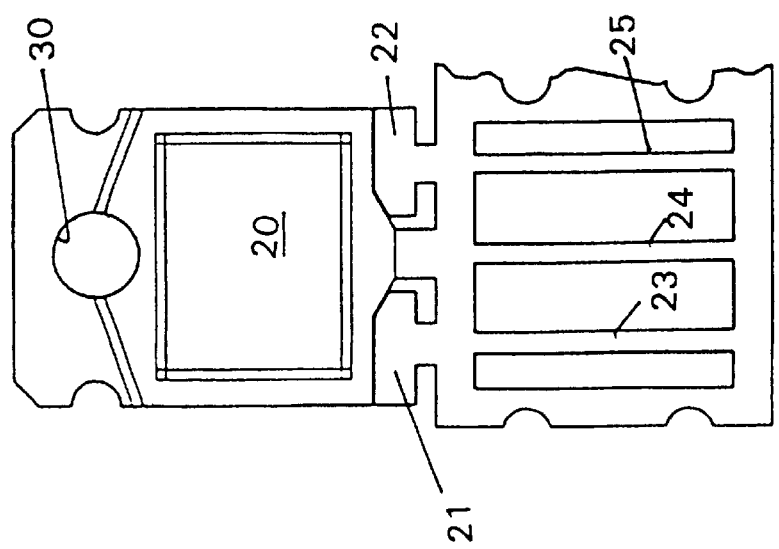
FIG. 1 shows the lead frame for one version of a prior art TO-264 package.

Referring first to FIG. 1, the lead frame shown is a conventional flat copper stamping in which each element has a main die receiving area or paddle 20, bond wire posts 21 and 22 and extending conductor legs 23, 24 and 25. The central leg 24 is integrally connected to paddle region 20, and is therefore connected to the bottom of a semiconductor die mounted atop region 20, 1 which, for example, may be the bottom drain electrode of a MOSFET die. The die source electrode and gate electrode are wire bonded to posts 21 and 22. After the die is mounted on region 20 and is wire bonded to the lead posts, the lead frame and die are transfer molded into a suitable molded housing and the excess metal of the lead frame is trimmed to separate lead conductors 23, 24 and 25 from one another. The bottom surface of paddle 20 is left exposed and may be nickel-plated.

It will be noted that the main body of the lead frame of FIG. 1 has a mounting hole 30. This reduces the area of the lead frame which can receive a die. Furthermore, when a bolt is used to press the bottom surface of the paddle area 20 of the lead frame against a heat sink, the force is applied in cantilever and is not over the die area of the housing. This leads to poor thermal resistance to the heat sink resulting from the uneven force by which the lead frame is held against the heat sink. The location of mounting hole 30 causes more pressure to be applied at the portion of the lead frame closest to the mounting hole, such that the contact pressure decreases at distances further from the mounting hole. Thus, the thermal resistance between the lead frame and the device increases as the distance from the mounting hole increases. Also, the location of mounting hole 30 causes an increased likelihood of fracture of the die due to bending stresses during installation.

Figure 2:
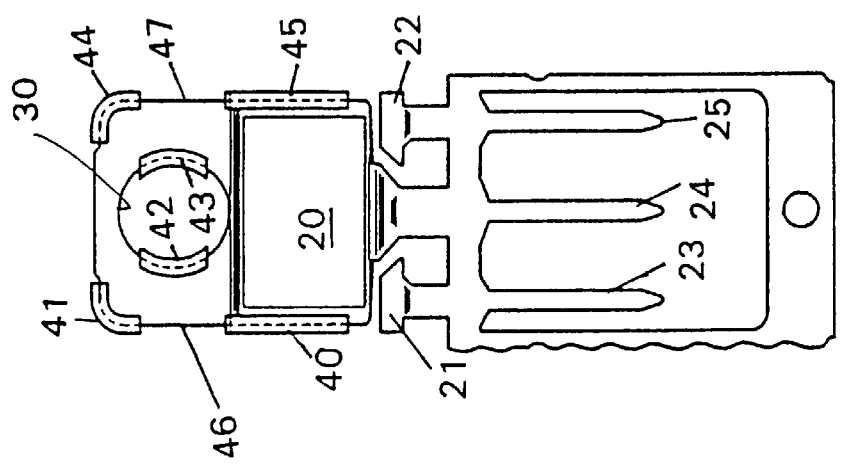
FIG. 2 shows the lead frame for a standard TO-247 prior art package.

FIG. 2 shows a standard TO-247 package lead frame, and its similarity to that of FIG. 1 will be apparent. Similar numerals in FIG. 2 identify parts similar to those of FIG. 1.

In the device of FIG. 2, the area 20 available to mount a die is substantially smaller than that of the much larger mounting area in the package of FIG. 1. FIG. 2 further shows mounting hole 30 and mold lock extensions 40 to 45 on the lead frame paddle. Mold lock extensions are metallic portions of the lead frame used to support the surrounding molded portion of the device. The mold lock extensions 40 are interrupted by clamp areas 46 and 47 which are areas which are clamped at their edges in the mold during the molding operation. In other words, clamping areas allow the lead frame to be held in a desired orientation while being molded. Clamping regions frequently are nickel-plated because they are exposed after the housing is molded. Further, these are areas at which moisture can enter the molded package to cause unexpected device failures.

FIG. 3 shows the lead frame of the present invention, in which parts similar to those of FIGS. 1 and 2 carry similar identifying numerals. The present invention differs from the packages shown in FIGS. 1 and 2 in several significant ways. First, in the present invention, the hole 30 is not used, thereby substantially increasing the die receiving area 20. In fact, the die receiving area 20 in the present invention is virtually doubled over the area of the TO-247 package shown in FIG. 2. Under this arrangement, a die 26 is preferably surface mounted onto die receiving area 20.

Second, the lead frame lock extensions are changed to segments 50, 51 and 52, leaving corner regions 53 and 54 (which may optionally be nickel plated) for lead frame clamping. Regions 53 and 54 are positioned away from the die area and improve the moisture resistance of the package as compared with retaining the clamping regions on the lateral portions of the lead frame as shown by areas 46 and 47 in FIG. 2. This is the case because the length of the clamping area is smaller than in the prior art packages shown in FIG. 2 and allows less moisture to enter the molded package, and because the placement of mold clamping regions 53 and 54 away from the die area requires that damaging moisture travel a longer distance to reach the die as compared with retaining the clamping areas on the lateral portions of the lead frame. In the present invention, the increased die area associated with the inventive package is closer to the sides of the lead frame than it is to the corners. Thus retaining the clamping areas on the lateral portions of the lead frame would reduce the moisture resistance as compared with the typical package as shown in FIG. 2. An improvement is realized by locating mold clamping areas to regions 53 and 54.

In addition, mold clamping regions 53 and 54 are preferably flattened to a thickness smaller than that of the remainder of paddle area 20. The process by which the lead frames are stamped typically creates a pulled radius area, i.e., a non-square angle between the planar surface of the lead frame and the lateral surface. This can negatively effect clamping strength. To overcome this deficiency, regions 53 and 54 are flattened to create an approximately square corner angle between the planar surface of the lead frame and the lateral surface. The flattening process also thins the corner region and facilitates improved clamping.

Third, the cross-sectional area of legs 23, 24 and 25 is increased (to carry 85 amperes RMS, instead of 70 amperes RMS for the package of FIG. 2) and their edges may be chamfered to allow them to fit into a circuit board opening of the same size used to accommodate a prior art device such as the typical TO-247 package.

Figure 4:
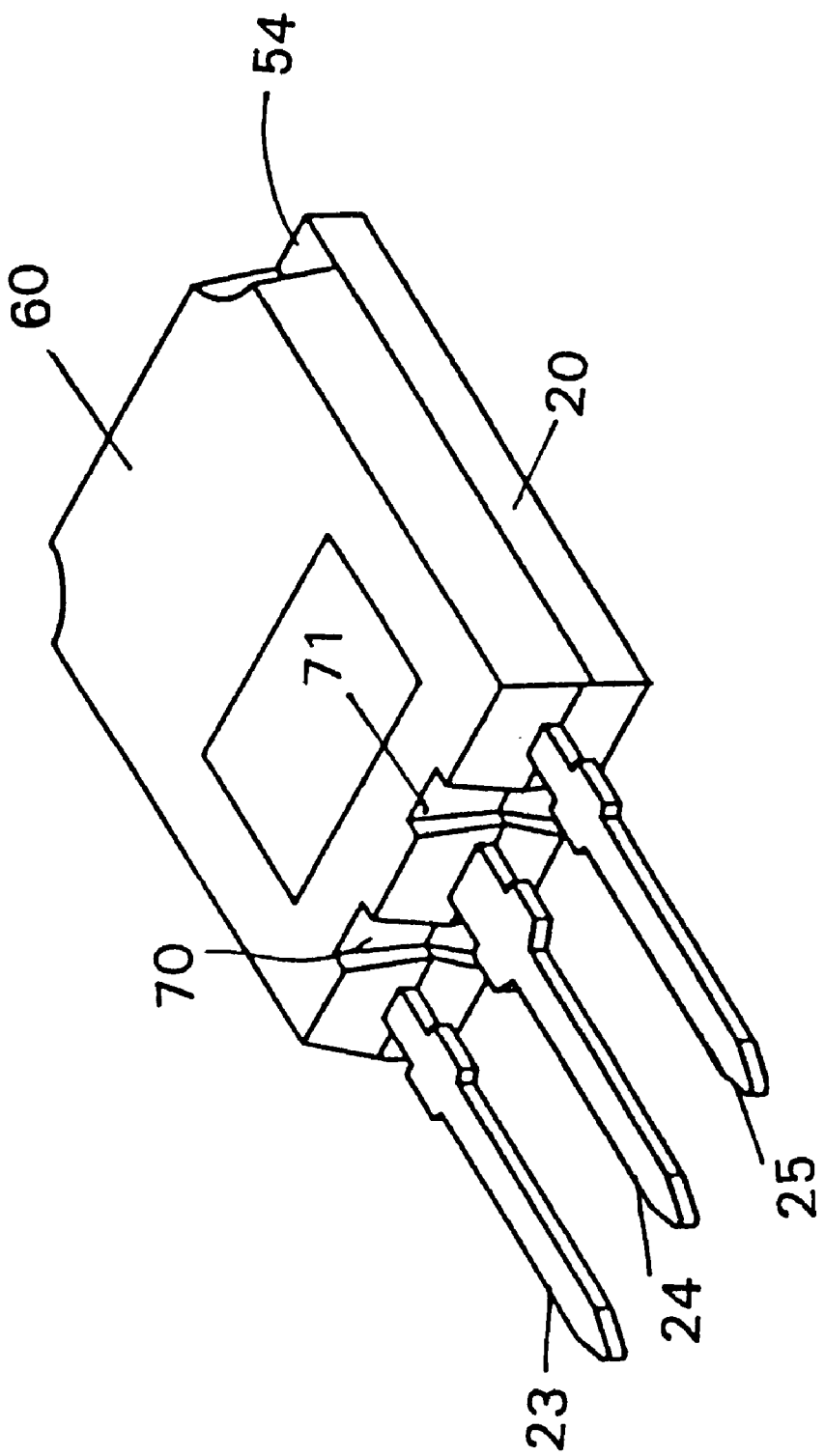
FIG. 4 shows the novel package of the invention with the novel lead frame of FIG. 3.

FIG. 4 shows the lead frame of FIG. 3 after the transfer molding of plastic housing (package) 60 and the trimming of excess lead frame areas. Package 60 is molded to surround the die and wire bonds, and is preferably molded around the sides 55 of the paddle section 20, thereby leaving the bottom of the paddle 20 exposed. Mold clamping regions 53 and 54 are optionally left uncovered by package 60 on their upper and lower surfaces. It should be noted that the plastic housing contains novel slots 70 and 71 to increase the creepage distance between leads 23–24 and 24–25. The creepage distance being the circumferential length around the outer edge of package 60 measured between adjacent leads.

Figure 5:
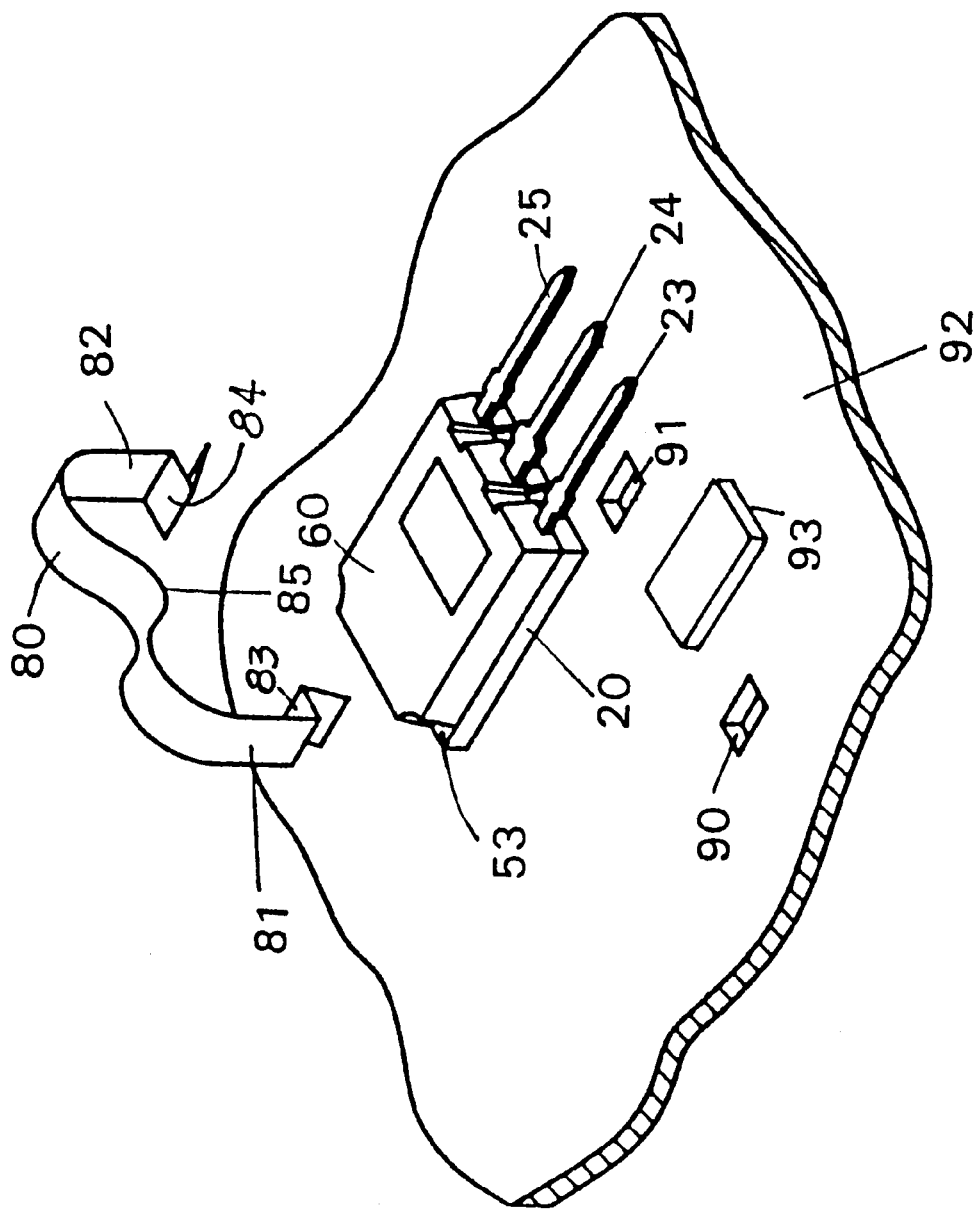
FIG. 5 shows the package of FIG. 4 with a first type of spring clip mount.
Figure 6:
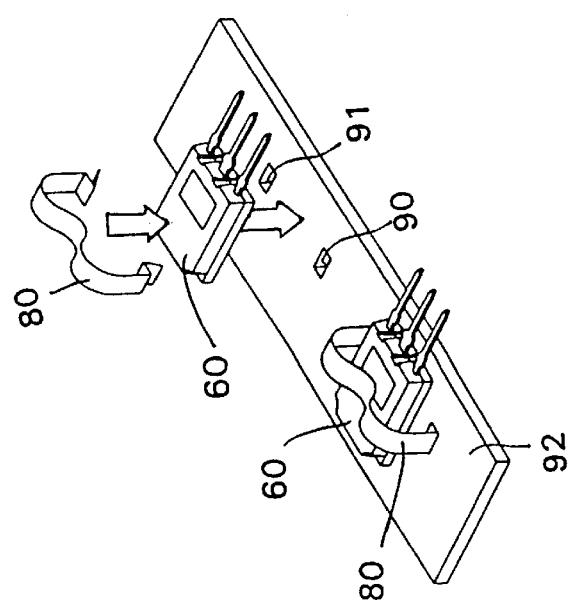
FIG. 6 shows the arrangement of FIG. 5 for mounting two packages.

FIG. 5 shows the novel clip mounting of package 60. Because a mounting hole for increased pressure with a heat sink is not provided in the package of the present invention, a clip mounting is needed to properly affix package 60 to a circuit board or heat sink. A spring clip 80 is provided having legs 81 and 82 with snaps 83 and 84 respectively and a reentrant pressure bridge portion 85. Package 60 and bridge portion 85 can be arranged such that bridge portion 85 applies pressure to package 60 at approximately the center of the die area, thereby minimizing thermal resistivity. Also, the pressing arrangement of bridge portion 85 does not cause package 60 to be bent or unevenly stressed upon installation. Snaps 83 and 84 are adapted to snap into openings 90 and 91 of support 92. Support 92 may have a conductive surface 93 which is pressed into contact with the bottom of pad 20 by spring 80. Plural devices can be mounted to surface 92 as shown in FIG. 6, with one device already mounted.

Figure 7:
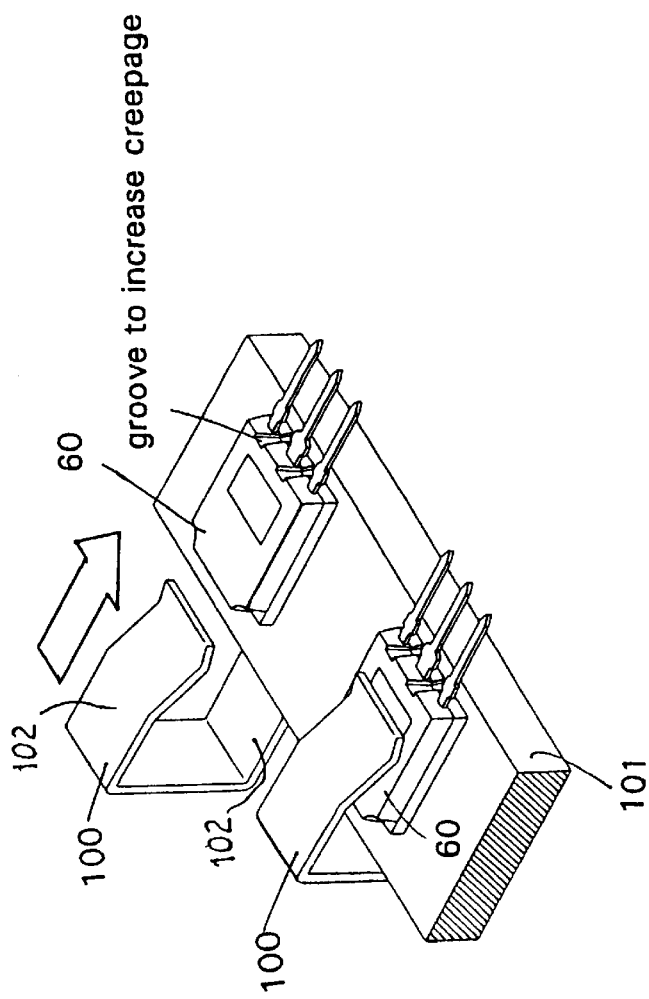
FIG. 7 shows a modified spring or clip mount assembly.

As shown in FIG. 7, the spring clip may be U-shaped clip 100 which clips onto the top of package 60 and the bottom of support/heat sink 101. The inward clamping force applied by lateral arms 102 holds package 60 in place. This arrangement allows package 60 to be mounted to support/heat sink 101 without the need to provide clip mounting openings in support/heat sink 101. Package 60 and U-shaped clip 100 can be arranged such that lateral arms 102 apply pressure to package 60 at approximately the center of the die area, thereby minimizing thermal resistivity. Also, because pressure is applied at approximately the center of the die area, package 60 is not subject to bending forces or unevenly stressed upon installation.

Figure 8:
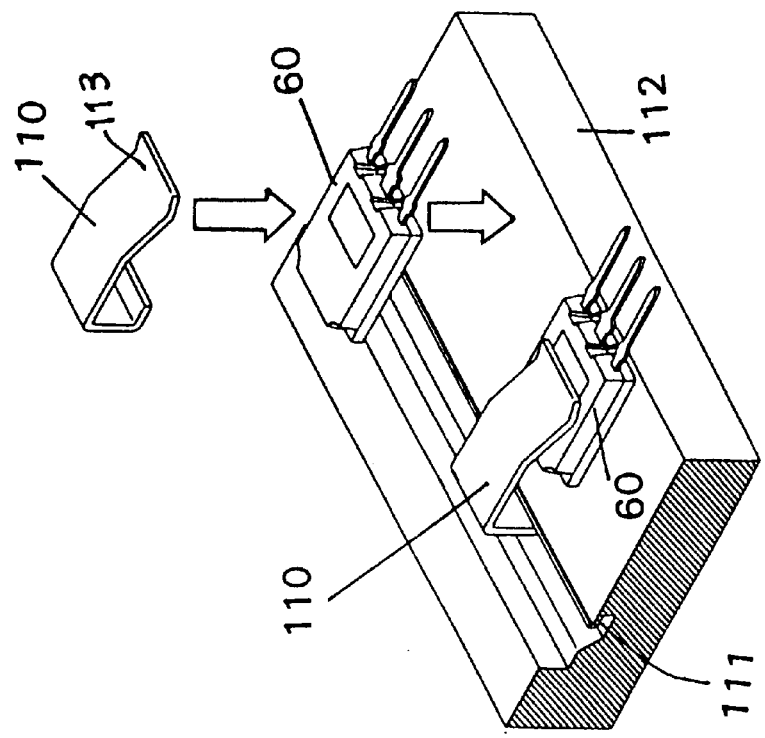
FIG. 8 shows a further modified clip mount assembly.

FIG. 8 shows the use of cantilevered springs 110 which clip into slot 111 of heat sink 112. This arrangement allows package 60 to be mounted to heat sink 112 without the need to provide clip mounting openings in heat sink 112 and without the need to straddle an end of the heat sink as required by U-shaped clip 100 shown in FIG. 7. In this arrangement the cantilever action causes arm 113 to apply a downward force against package 60, preferably against the center of the die area. The application of pressure to package 60 at approximately the center of the die area minimizes thermal resistivity. Also, because pressure is applied at approximately the center of the die area, package 60 is not subject to bending forces or unevenly stressed upon installation.

Figure 9:
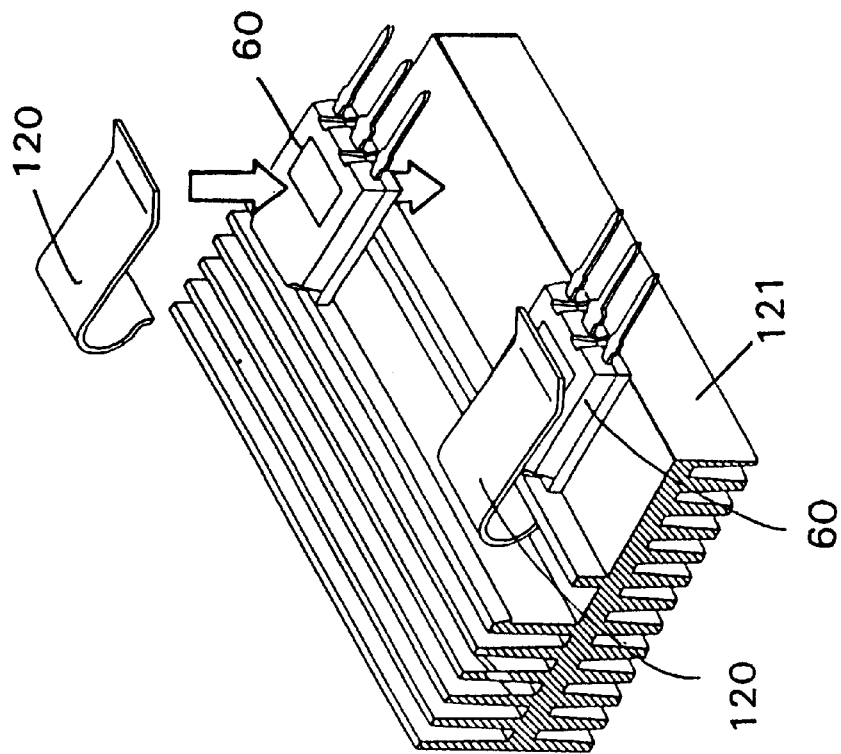
FIG. 9 shows a further modified clip mount assembly.

FIG. 9 shows a further type of spring clip 120 and another type of finned heat sink 121. Spring clip 120 is held in place against finned heat sink 121 such that it provides a downward pressure to package 60 to hold the device in place.

FIG. 10 shows the contact force on package 60 by the spring clips as a function of thermal resistance between package 60 and the heat sink/support. The spring clips shown typically apply a force of between about 20 to about 40 Newtons to produce a thermal resistance less than about 0.24° C./W. It has been found that no damage is caused to the package for spring forces less than about 2000 Newtons.

The present invention therefore provides a semiconductor device package which accommodates a semiconductor die of an increased size as compared with similarly sized device packages. This arrangement allows the semiconductor device to support higher operating currents than similarly sized device packages. Also, the semiconductor device package of the present invention is arranged such that the mold clamping area is positioned away from the die, thereby reducing the area from which damaging moisture can enter the molded package and increasing the distance required for moisture to contact the die.

The notch provided in package 60 serves to increase the creepage distance between adjacent leads, thereby decreasing the capacitive effects on the leads from the package 60 material.

The novel clipping arrangements of the present invention allow the increased operating temperatures associated with the increased operating currents to be efficiently dissipated from the package 60 by providing superior thermal contact and low thermal resistance. Further, the novel clipping arrangements allow package 60 to be easily mounted to a circuit board or heat sink in a manner which does not physically stress the package or semiconductor die.

The present invention may be embodied in other specific forms without departing from the spirit or essential attributes thereof and, accordingly, reference should be made to the appended claims rather than to the foregoing specification as indicating the scope of the invention.

What is claimed is:

1. A semiconductor device package comprising:

a plurality of legs at least one of which includes a paddle section, said paddle section being continuous and free of openings therethrough;

a semiconductor die mounted to said paddle section, said semiconductor die occupying substantially all of a surface area of a side of said paddle section upon which said semiconductor die is mounted;

a common and uninterrupted molded housing covering said semiconductor die and at least the side of said paddle section upon which said semiconductor die is mounted, said molded housing being free of mounting openings therethrough, wherein said plurality of legs are arranged to protrude from said molded housing along a common plane;

at least one slot on an outer portion of said molded housing perpendicular to a direction of protrusion of said plurality of legs from said molded housing and positioned between two adjacent legs of said plurality of legs, said at least one slot extending from a top of said molded housing to a bottom of said molded housing, a width of said at least one slot being larger at said top and said bottom of said molded housing than at a mid-point of said at least one slot.

2. A semiconductor device package comprising:

a molded housing;

a plurality of conductive legs penetrating a common side of said molded housing, said plurality of conductive legs being spaced apart from, and substantially parallel to, one another;

a conductive paddle integral with at least one of said plurality of conductive legs, said conductive paddle having a surface for receiving a semiconductor device, and being free of openings therethrough;

a conductive paddle integral with at least one of said plurality of conductive legs, said conductive paddle having a surface for receiving a semiconductor device, and being free of openings therethrough;

a semiconductor device mounted on said surface for receiving a semiconductor device; and a plurality of slots each formed in said common side of said molded housing, each one of said plurality of slots being positioned between a pair of said legs to increase a creepage distance between said pair of legs, wherein said molded housing encapsulates said semiconductor device.

3. The semiconductor device package of claim 2, wherein a width of each of said plurality of slots is larger at said top and said bottom of said molded housing than at a mid-point thereof.

4. The semiconductor device package of claim 2, wherein said conductive paddle includes a second surface opposite to said surface for receiving a semiconductor device, said second surface being exposed through said molded housing.

5. The semiconductor device package of claim 2, wherein said semiconductor device substantially covers said surface for receiving said semiconductor device.

6. The semiconductor device package of claim 2, wherein said conductive paddle further comprises at least one mold clamping region, said at least one mold clamping region being positioned away from said semiconductor device to reduce the penetration of moisture into said semiconductor device package.

7. The semiconductor device package of claim 6, wherein said semiconductor device is substantially rectangularly shaped, and said at least one mold clamping region is positioned opposite a corner of said semiconductor device.

* * * * *